US007817396B2

(12) United States Patent
Tao et al.

(10) Patent No.: US 7,817,396 B2
(45) Date of Patent: Oct. 19, 2010

(54) HIGH EFFICIENCY AND HIGH BANDWIDTH PLASMA GENERATOR SYSTEM FOR FLOW CONTROL AND NOISE REDUCTION

(75) Inventors: Fengfeng Tao, Clifton Park, NY (US); Seyed Gholamali Saddoughi, Clifton Park, NY (US); Robert Carl Murray, Rotterdam, NY (US); Abdelkrim Younsi, Ballston Lake, NY (US); Steven Martens, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 439 days.

(21) Appl. No.: 11/978,091

(22) Filed: Oct. 25, 2007

(65) Prior Publication Data

US 2009/0108759 A1 Apr. 30, 2009

(51) Int. Cl.
*H02H 7/20* (2006.01)
*H03K 3/00* (2006.01)

(52) U.S. Cl. ....................... 361/112; 307/106; 307/107; 307/108

(58) Field of Classification Search ................. 361/112; 307/106, 107, 108
See application file for complete search history.

(56) References Cited

U.S. PATENT DOCUMENTS

2008/0106151 A1* 5/2008 Ryoo et al. ................. 307/106

FOREIGN PATENT DOCUMENTS

WO WO 2006/057365 * 1/2006

OTHER PUBLICATIONS

"Flow and Noise Control in High Speed and High Reynolds Number Jets Using Plasma Actuators," M. Samimy et al., 3rd AIAA Flow Control Conference, Jun. 2006 (See particularly Fig. 3 and pp. 7-9).

* cited by examiner

*Primary Examiner*—Fritz M. Fleming
*Assistant Examiner*—Lucy Thomas
(74) *Attorney, Agent, or Firm*—Francis T. Coppa

(57) ABSTRACT

A plasma generation system includes a pulse generator having at least one switch and that is configured to convert a DC voltage to a desired high frequency, high breakdown voltage pulse sufficient to break down a high-breakdown voltage gap, wherein all pulse generator switches are solely low to medium voltage, high frequency switches, and further configured to apply the breakdown voltage to a plasma load for the generation of plasma. In one application, the plasma generation system is useful to manipulate the flow of jets and provide highly efficient acoustic noise reduction.

15 Claims, 2 Drawing Sheets

HIGH EFFICIENCY AND HIGH BANDWIDTH PLASMA GENERATOR SYSTEM FOR FLOW CONTROL AND NOISE REDUCTION

BACKGROUND

The invention relates generally to plasma generation, and more specifically a method and system to manipulate the flow of high speed jets to alter the characteristics to achieve, without limitation, high efficiency acoustic noise reduction.

Acoustic noise radiated from an aircraft gas turbine engine becomes the dominant component of noise during periods of aircraft takeoff and landing. Previous investigations of plasma-based flow control and noise reduction have shown some promising results. Such investigations however, have been limited to a small scale laboratory environment and not large, full-scale engine applications, due to the incapability of simultaneous operation of a large number of plasma actuators.

Known plasma flow and noise control systems and methods require prohibitively expensive components to deal with the requisite high power, high voltage and high repetition rates required to implement plasma flow and noise control of high speed jets. Such systems and methods are known to employ high power, high voltage DC power supplies together with high speed, high voltage MOSFET switches (such as a Behlke switch), liquid cooling, and high voltage, high power ceramic resistors, resulting in bulky and very inefficient systems. These known plasma flow and noise control systems typically waste more than 500 W of power in the form of heat while generating about 20 W of useable power.

It would be both advantageous and beneficial to provide a system and method of implementing plasma-based flow control and noise reduction for high speed jets and that is capable of operating at very high speeds and high repetition rates with high efficiency low energy consumption. It would be further advantageous if the system and method could be implemented at a cost that is substantially less than the cost associated with implementing the foregoing known plasma flow and noise control systems and methods. It would be further advantageous if the system and method could be easily configured for use in any flow control area where flow instabilities are involved, i.e. boundary layer control, combustion instabilities, potentially thrust vectoring, and the like.

BRIEF DESCRIPTION

Briefly, in accordance with one embodiment, a plasma generation method and system are provided to manipulate the flow of high speed jets to alter the characteristics to achieve, without limitation, high efficiency acoustic noise reduction.

The plasma generation system according to one embodiment comprises a pulse generator comprising one or more switches and that is configured to convert a DC voltage to a desired high frequency, high voltage pulse sufficient to break down a high-breakdown voltage gap, wherein all pulse generator switches are solely low to medium voltage, high frequency switches, and that is further configured to apply the high voltage pulse to a plasma load for the generation of plasma.

According to another embodiment, a method of generating plasma comprises:

providing a pulse generator comprising one or more switches, wherein all pulse generator switches are solely low to medium voltage, high frequency switches;

converting a DC voltage to a desired high frequency, high voltage pulse sufficient to break down a high-breakdown voltage gap via the pulse generator; and applying the breakdown voltage to a plasma load for the generation of plasma.

DRAWINGS

These and other features, aspects, and advantages of the present invention will become better understood when the following detailed description is read with reference to the accompanying drawings in which like characters represent like parts throughout the drawings, wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

Figure 1:
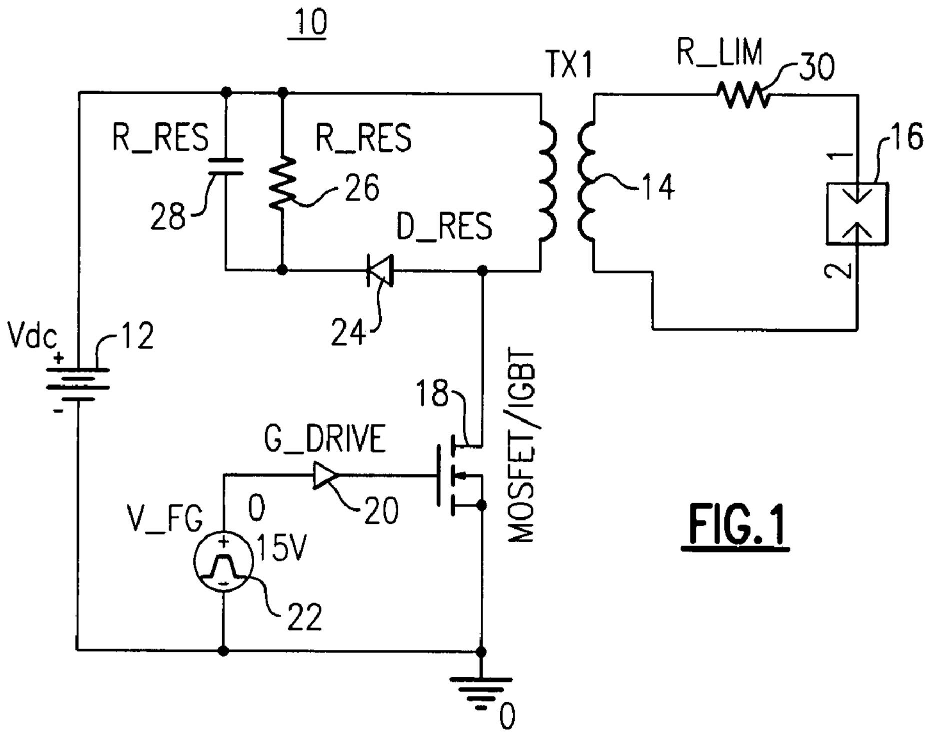
FIG. 1 is a circuit diagram illustrating a plasma generation system according to one embodiment.

FIG. 1 is a circuit diagram illustrating a plasma generation system 10 according to one embodiment. Plasma generation system 10 functions in one embodiment to manipulate the flow of high speed jets to alter the characteristics to achieve, without limitation, high efficiency acoustic noise reduction. This is accomplished by generating a desired high frequency breakdown voltage pulse that is applied to a plasma load 16 for the generation of plasma.

Low voltage switches, as used herein, means switches rated at 600 volts and below.

Medium voltage switches, as used herein, means switches rated at about 1 kilovolt, and can include switches rated up to 4 kilovolts.

High voltage switches, as used herein, means switches rated above 4 kilovolts.

With continued reference to FIG. 1, plasma generation system 10 can be seen having its output connected to a hot plasma load 16. A DC voltage supply 12 generates a desired DC voltage at the input side of the plasma generation system 10. The DC voltage supply can, for example, be a low to medium voltage battery or a low to medium voltage DC bus voltage that generates a low to medium DC voltage in one embodiment of about 70 VDC. This DC voltage is applied across the primary winding side of a high voltage, high frequency transformer 14 as described herein below.

The high voltage, high frequency transformer 14 is employed to transform a low to medium voltage (e.g. 70 VDC), high frequency input pulse into a high voltage (e.g. 10 kV breakdown voltage), high frequency pulse at the output of the transformer 14. The high voltage, high frequency transformer is configured to generate the breakdown voltage pulse at high pulse frequencies up to about 500 kHz.

A low to medium voltage, high frequency solid state switch 18 such as, but not limited to, a MOSFET or IGBT device is connected between one leg of the transformer 14 and a reference ground. The solid state switch 18 advantageously can switch on and off at frequencies of up to about 500 kHz without the necessity to provide any type of cooling apparatus to prevent overheating or incurring damage such at that which would commonly occur when using high voltage, high frequency solid state switching devices that require a special cooling apparatus. Further, use of high voltage, high frequency solid state switches are prohibitively expensive if they are required to switch voltage signals in a high voltage (e.g. 10 kV) range. Switch 18 is configured to apply the DC voltage generated via DC voltage supply 12 across the primary winding side of transformer 14 each time switch 18 is turned on and to disconnect the DC voltage from the primary winding side of transformer 12 each time switch 18 is turned off.

A function generator 22 is configured to generate a desired pulse signal that is applied to operate the solid state switch 18. The embodiment depicted in FIG. 1 employs a low to medium voltage, high frequency MOSFET or IGBT switch 18. The desired pulse signal passes through a gate driver 20 to turn the MOSFET or IGBT switch on and off at a desired pulse rate of up to about 500 kHz. The function generator 22 can be programmable, manually controlled, or close looped to control the characteristics of the desired pulse signal, including but not limited to the repetition rate and the duration of the pulse signal, and/or vary the switching frequency in the kilo-Hz range up to about 500 kHz.

Plasma generation system 10 also includes a reset diode 24, a reset resistor 26 and a reset capacitor 28 that are together configured as a reset circuit for the primary winding side inductance of transformer 14. Together, these reset components 24, 26, 28 function to reset the voltage level in the transformer 14 primary winding each time switch 18 turns off by allowing the current flowing in the primary winding to dissipate through reset resistor 26 causing the requisite reset voltage to occur across reset capacitor 28. In this way, the low to medium voltage switch 18 is protected against excessive current buildup in the primary winding side transformer inductance during the high frequency switching process. A lossless active reset circuitry could be used to improve efficiency.

An impedance such as, but not limited to, a resistor 30 is provided in series between one output leg of the high voltage, high frequency transformer 14 and the plasma load 16 to ensure the presence of a positive load impedance in applications where the plasma dynamic load impedance is actually negative.

In summary explanation, a plasma generation system 10 according to one embodiment then comprises a pulse generator having at least one switch 18 and configured to convert a DC voltage to a desired high frequency, high breakdown voltage pulse, wherein all pulse generator switches are solely low to medium voltage, high frequency switches, and further configured to apply the breakdown voltage to a plasma load 16 for the generation of plasma to control flow and noise reduction in high speed jets. Those skilled in the art will readily appreciate that the embodiments are not so limited however, and that plasma generation system 10 can just as easily be configured for use in any flow control area where flow instabilities are involved, i.e. boundary layer control, combustion instabilities, potentially thrust vectoring, and so forth.

Figure 2:
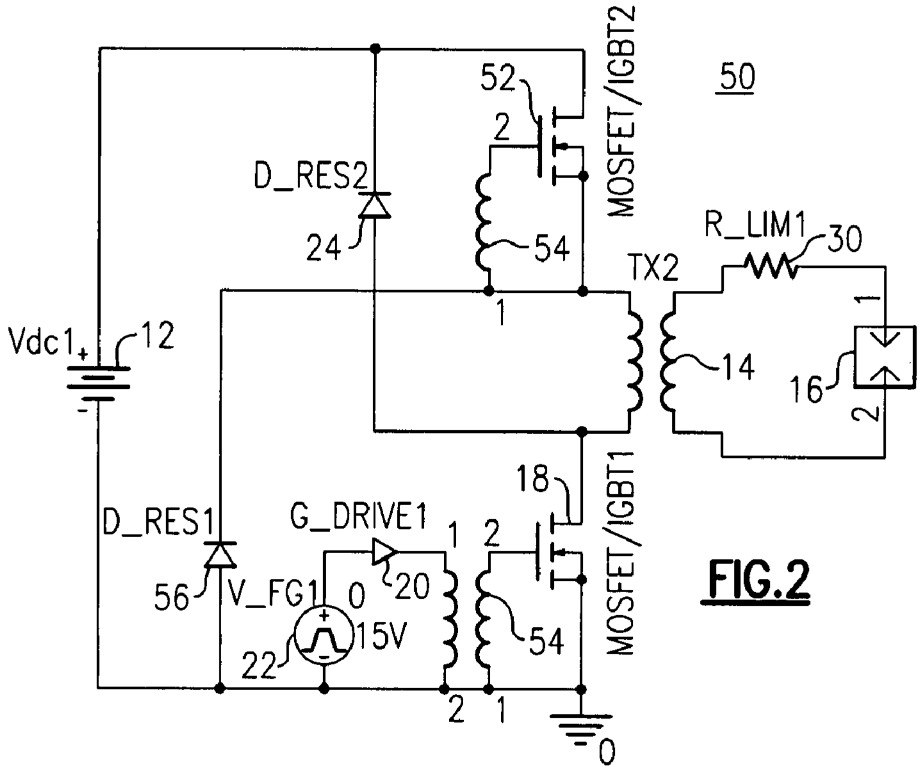
FIG. 2 is a circuit diagram illustrating a plasma generation system according to another embodiment.

FIG. 2 is a circuit diagram illustrating a plasma generation system 50 according to another embodiment. Plasma generation system 50 is similar in structure and function to plasma generation system 10 described above. Plasma generation system 50 includes a DC voltage supply 12 that is applied across the primary winding side of a high voltage, high frequency transformer 14 in a pulsed fashion in response to the switching action of a low to medium voltage, high frequency solid state switch 18.

A function generator 22 generates an output signal pulse to control the switching frequency of switches 18 and 52 via a gate driver 20 that passes current pulses generated by the function generator through the primary side of a gate drive transformer 54 to turn switches 18 and 52 on and off in unison since both switches are driven via the secondary winding of the gate drive transformer 54. Switch 18 operates in response to the function generator output signal pulse to connect one leg of the primary winding of transformer 14 to a reference ground when switch 18 is turned on and to disconnect the leg from the reference ground when switch 18 is turned off. Switch 52 operates in response to the function generator output signal pulse to connect the other leg of the primary winding of the transformer 14 to the other rail of the DC voltage when switch 52 is turned on and to disconnect the leg from the DC rail when switch 52 is turned off.

A primary winding reset circuit includes reset diodes 56 and 24. Current is then allowed to flow through the primary winding side of transformer 14 when switches 52 and 18 are turned on by the function generator 22; while current flow through the primary winding side of transformer 14 resets the winding through diodes 24 and 56 when switches 52 and 18 are turned off.

The reset circuit in plasma generation system 50 is configured to use the DC voltage supply 12 to reset the voltage across the primary winding side of transformer 14 as compared to the reset circuit in plasma generation system 10 that uses the voltage developed across reset capacitor 28 to reset the voltage across the primary winding side of transformer 14. The reset circuit configuration of plasma generation system 50 then advantageously results in a substantially lossless power reset architecture.

Figure 3:
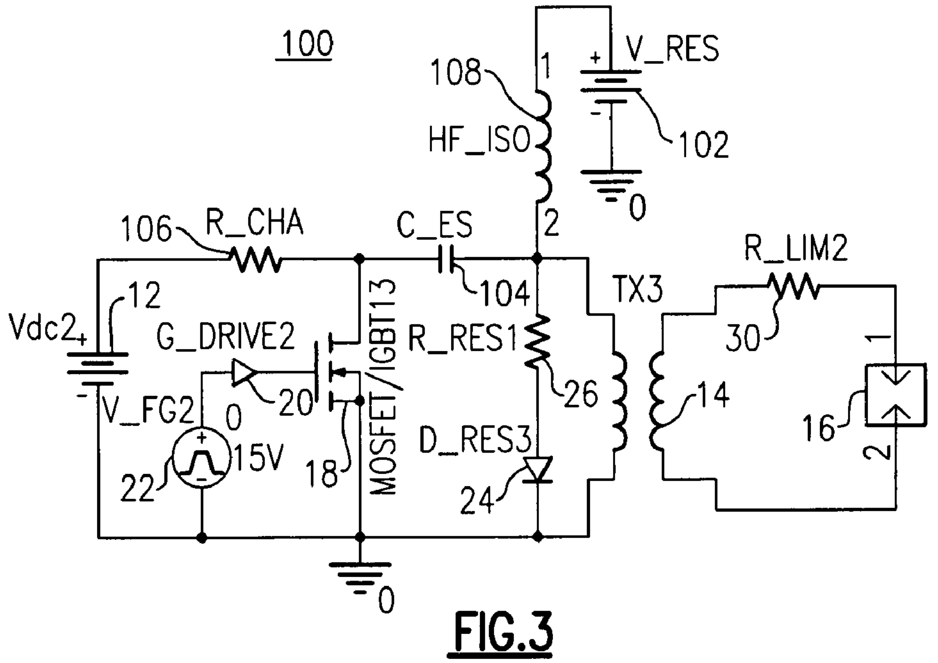
FIG. 3 is a circuit diagram illustrating a plasma generation system according to yet another embodiment.

FIG. 3 is a circuit diagram illustrating a plasma generation system 100 according to yet another embodiment. The circuit architecture of plasma generation system 100 is configured such that as the low to medium voltage, high frequency switch 18 is turned on and off via the gate drive function generator 22, a capacitor 104 is charged to a desired level that is controlled via a charging impedance, such as, but not limited to a resistor 106. Capacitor 104 is thus charged when switch 18 is turned off. This charge stored in capacitor 104 is then dumped into the plasma load 16 when switch 18 is turned on. This architecture is useful to control and tailor the amount of charge that is required to generate plasma in a particular application or, for example, a particular jet engine location, and results in a system that is more power efficient than the architecture of FIG. 1.

A reset circuit including a second low to medium voltage DC voltage source 102, high frequency inductor 108, reset resistor 26 and reset diode 24 is employed in plasma generator 100 to reset the primary winding voltage of transformer 14 when switch 18 is turned back on.

A current-limiting impedance, such as a resistor 30, is configured in series with the hot plasma load 16 to limit the current that can flow to the load 16 during each pulse cycle.

Figure 4:
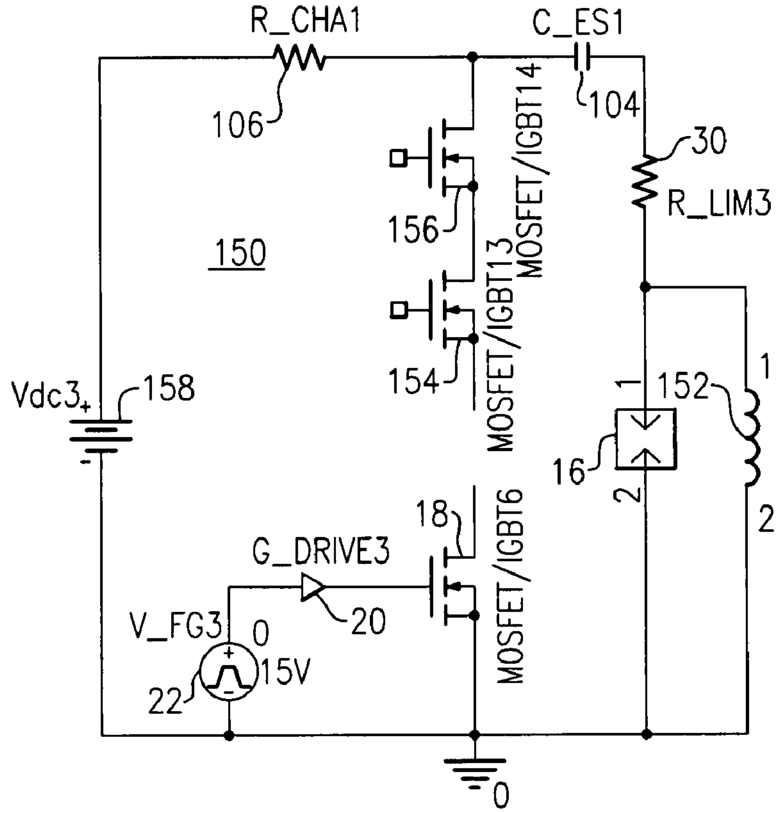
FIG. 4 is a circuit diagram illustrating a plasma generation system according to still another embodiment.

FIG. 4 is a circuit diagram illustrating a plasma generation system 150 according to still another embodiment. Plasma generation system 150 employs a high voltage (e.g. 10 kV) DC input supply 158 instead of a low to medium voltage (e.g. 70V) DC input supply 12 as used in the plasma generation systems 50, 100, 150 described above with reference to FIGS. 1-3 respectively.

A plurality of low to medium voltage, high frequency switching devices such as low to medium voltage, high frequency MOSFET or IGBT devices 18, 154, 156 are configured in series and switched in unison to charge a capacitor 104 when the plurality of switching devices are turned off. Turning the plurality of switching devices on yields a high voltage applied to the hot plasma load 16 as the charge developed in capacitor 104 flows through a current limiting impedance, such as, but not limited to, a resistor 30 and finally through an inductor 152. A charge control impedance, such as, but not limited to, a resistor 106 is used to control the amount of charge stored via capacitor 104 in the same fashion as discussed herein before with reference to FIG. 3.

The series MOSFET configuration architecture of plasma generation system 150 is advantageous over a system architecture that employs a single high voltage, high frequency switching MOSFET since the on-resistance of a MOSFET is proportional to a factor greater than the square of the breakdown voltage. Current ratings are typically greater for a plurality of MOSFET devices in series than for a single MOSFET device that is rated at n times the breakdown voltage.

While the plasma generation system 150 architecture is more costly to manufacture than the embodiments 10, 50, 100 discussed with reference to FIGS. 1-3, plasma generation system 150 is still much more efficient to operate and less expensive to manufacture when compared with known plasma generator systems that employ high power, high voltage DC power supplies together with high speed, high voltage MOSFET switches with liquid cooling and high voltage, high power ceramic resistors. Plasma generation systems 10, 50, 100, 150 are also less bulky and occupy less real estate than known plasma generator systems.

In summary explanation, particular embodiments of a plasma generation system described with reference to FIGS. 1-4, each function to convert a DC voltage to a desired high frequency breakdown voltage in response to the switching action of one or more low to medium voltage, high frequency solid state switches, and apply the breakdown voltage to a plasma load for the generation of plasma. No high speed, high voltage solid state (e.g. MOSFET) switches are employed in the plasma generation system described herein with reference to FIGS. 1-4. Further, particular embodiments do not even employ a high power, high voltage DC power supply. None of the embodiments employ liquid cooling or high power resistors that result in a bulk and very inefficient system. The embodied plasma generators further do not require costly prohibitive expensive components that are necessary to deal with high power, high voltage, and high repetition rates, such as those required in known plasma generator systems since all plasma generator switches are solely low voltage and/or medium voltage switches.

Advantages associated with plasma generators 10, 50, 100, 150 include, but are not limited to:

use of low voltage commercially available solid state switches (e.g. MOSFETs and IGBTs) as switching devices which provides such benefits as low cost, low energy consumption and very high speed (about nanosecond rise time) and a high repetition rate;

generation of highly efficient generation of breakdown voltage(s) for the initiation of plasma;

use of a highly efficient, high bandwidth transformer that provides isolation for safety;

use of lossless ballast component(s) that yield dramatic power reduction to substantially eliminate wasted power;

an architecture that allows multi-channel, independent operation;

an architecture that does not require any type of liquid cooling; and an advanced control strategy that provides flexible control over a wide range of frequency, phase, duty ratio, and power.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A plasma generation system comprising a pulse generator comprising one or more switches and that is configured to convert a DC voltage to a desired high frequency, high voltage pulse sufficient to break down a high-breakdown voltage gap, wherein all pulse generator switches are solely low to medium voltage, high frequency switches selected from MOSFET devices and IGBT devices, and that is further configured to apply the high voltage pulse to a plasma load for the generation of plasma, the pulse generator further comprising a high bandwidth, high voltage transformer that is configured to convert a low to medium voltage, high frequency input pulse to the high voltage, high frequency pulse.

2. The plasma generation system of claim 1, wherein the pulse generator is further configured to generate the low to medium voltage, high frequency input pulse.

3. The plasma generation system of claim 1, further comprising a primary winding reset circuit configured to reset a primary winding voltage associated with the transformer during conversion of the low to medium voltage, high frequency input pulse to the high voltage, high frequency pulse.

4. The plasma generation system of claim 1, wherein the pulse generator further comprises a function generator that is configured to generate a stream of pulse signals having a desired duty cycle, power level, and phase characteristic, such that the stream of pulse signals turn the switches on and off at the desired high frequency.

5. The plasma generation system of claim 4, wherein the desired high frequency pulse is generated at frequencies up to about 500 kHz.

6. The plasma generation system of claim 1, further comprising an impedance element in series with the plasma load, and that is configured to transform a negative plasma load impedance into a desired positive load impedance.

7. The plasma generation system of claim 1, further comprising a charge storage device that is configured to transfer a desired level of energy to the plasma load during application of the high frequency, high voltage pulse to the plasma load.

8. The plasma generation system of claim 7, further comprising a charge storage control element that is configured to control the amount of charge stored by the charge storage device.

9. The plasma generation system of claim 1, wherein the DC voltage is a low DC voltage.

10. The plasma generation system of claim 1, wherein the DC voltage is a medium DC voltage.

11. The plasma generation system of claim 1, wherein the DC voltage is a high DC voltage.

12. A method of generating plasma comprises:

providing a pulse generator comprising a high frequency, high voltage transformer and one or more switches, wherein all pulse generator switches are solely low to medium voltage, high frequency switches selected from MOSFET devices and IGBT devices;

converting a DC voltage to a desired high frequency, low voltage pulse signal;

converting the desired high frequency, low voltage pulse signal to a high frequency, high breakdown voltage pulse sufficient to break down a high-breakdown voltage gap via the high frequency, high voltage transformer; and applying the breakdown voltage pulse to a plasma load for the generation of plasma.

13. The method of claim 12, wherein the DC voltage comprises a low DC voltage.

14. The method of claim 12, wherein the DC voltage comprises a medium DC voltage.

15. The method of claim 12, wherein the DC voltage comprises a high DC voltage.

* * * * *